United States Patent
Lee

(12) 
(10) Patent No.: US 6,303,442 B1
(45) Date of Patent: Oct. 16, 2001

(54) MASK ROM AND METHOD FOR FABRICATING THE SAME

(75) Inventor: Ki Jik Lee, Chungcheongbuk-do (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/299,576

(22) Filed: Apr. 27, 1999

(30) Foreign Application Priority Data

Sep. 29, 1998 (KR) .................................................. 98-40626

(51) Int. Cl.$^7$ .............................................. H01L 21/8236
(52) U.S. Cl. ............................ 438/276; 438/130; 438/598
(58) Field of Search .................................... 438/130, 275, 438/276, 277, 278, 598

(56) References Cited

U.S. PATENT DOCUMENTS

| | | |
|---|---|---|
| 5,308,781 | 5/1994 | Ando et al. ............................ 437/48 |
| 5,600,171 * | 2/1997 | Makihara et al. ..................... 438/130 |
| 5,691,216 * | 11/1997 | Yen et al. .............................. 438/276 |
| 6,136,683 * | 10/2000 | Saito ...................................... 438/622 |

* cited by examiner

*Primary Examiner*—Chandra Chaudhari
(74) *Attorney, Agent, or Firm*—Fleshner & Kim, LLP

(57) ABSTRACT

Mask ROM and method for fabricating the same, are disclosed, which is operative at a fast speed and a low voltage, including a semiconductor substrate, a first insulating film formed on the semiconductor substrate, conductive layer patterns formed on the first insulating film, a first, and a second impurity regions formed in the semiconductor substrate on both sides of the conductive layer patterns, a second insulating film formed on the first insulating film inclusive of the conductive layer patterns, a contact hole formed in the second insulating film on the conductive layer patterns, a plug formed in each of the contact holes, and wordlines formed the second insulating film inclusive of the plugs.

23 Claims, 17 Drawing Sheets

MASK ROM AND METHOD FOR FABRICATING THE SAME

BACKGROUND OF THE INVENTION

1. Field of the Invention

The present invention relates to a mask ROM and a method for fabricating the same, and more particularly, to a mask ROM and a method for fabricating the same which is operative at a fast speed.

2. Background of the Related Art

Being a ROM for programming memory information in an integrated circuit fabrication process (a wafer process), the mask ROM can be written of a data only once, freely. As the mask ROM has no writing circuit, circuit is simple, as the mask ROM has a memory cell structure which requires no special process, the mask ROM is excellent in economy, the mask ROM has different memory cell systems applied to practice in different forms, the mask ROM is used differently according to purpose and use, and the mask ROM is featured in that a fabrication cost is the most economical inclusive of fabrication of a large size memory.

A related art method for fabricating a ROM will be explained with reference to the attached drawings. FIG. 1 illustrates a layout of a related art mask ROM, FIG. 2 illustrates a section across line I–I' in FIG. 1, and FIG. 3 illustrates a section across line II–II' in FIG. 1.

Referring to FIGS. 1~3, the related art mask ROM is provided with a semiconductor substrate 1 defined as a memory cell region A and a peripheral circuit region B; the memory cell region A is provided with first source and drain regions 2 and 3 formed in one direction at fixed intervals, and a plurality of wordlines 4 in a direction perpendicular to the direction of the first source and drain regions 2 and 3. The drain regions 3 are used as bitlines. And, the peripheral circuit region B is provided with gate electrode 5 in a direction the same with the direction of the first source and drain regions 2 and 3, and second source and drain regions 6 and 7 in the semiconductor substrate 1 on both sides of the gate electrode 5. There is a field oxide film 8 formed between the memory cell region A and the peripheral circuit region B, and the wordlines and the gate electrode 5 are insulated from the semiconductor substrate 1 by a gate oxide film 9 formed on the semiconductor substrate 1.

FIGS. 4a~4c illustrate layouts of FIG. 1 and sections across lines I–I' showing the steps of a fabricating method.

Referring to FIG. 4a, a field oxide film 8 is formed at an interface between a memory cell region A and a peripheral circuit region of a semiconductor substrate 1 which is defined as a memory cell region A and a peripheral circuit region B by general LOCOS(LOCal Oxidation of Silicon) process. Then, impurity ions of a conductivity opposite to a conductivity of the semiconductor substrate 1 in the memory cell region A are selectively injected into the memory cell region A, to form first source and drain regions 2 and 3 formed in one direction at fixed intervals. The drain regions 3 are used as bitlines. The peripheral circuit region B is not subjected to ion injection process for forming source and drain regions because the ion injection is done in self align after formation of the gate electrode (not shown). As shown in FIG. 4b, a gate oxide film 9 and a polysilicon layer are formed on an entire surface of the semiconductor substrate 1 inclusive of the field oxide film 8 in succession, wordline regions are defined, and the polysilicon layer is patterned (photolithography process+etching process) to leave the polysilicon only in the wordline region, to form a plurality of wordlines 4 crossed with the first source and drain regions 2 and 3. In this instance, the polysilicon layer on the peripheral circuit region B is also selectively patterned to form a gate electrode 5. The gate electrode 5 is patterned in a direction the same with the first source and drain regions 2 and 3. A resistivity per unit area of the wordline 4 of polysilicon is over approx. 6~7 $\Omega/\square$. In order to solve the problems of an increased RC (Resistance and Capacitance) delay and a large sized output terminal of a decoder which drives the wordlines both caused by a high density integration of the mask ROM, row decoder repeaters (not shown) are provided at intervals of the cells. The row decoder, corresponding to a length of approx. $1042(2^{10})$ cells, requires four of them if 4K×4K square array is provided, thereby solving the problems of the increased delay or the large sized decoder output terminal. And, as the source voltage is in a gradually lowered trend, such row decoder repeater becomes an essential element in a semiconductor device which requires high integration and a low voltage operation. As shown in FIG. 4c, impurity ions are injected into the semiconductor substrate on both sides of the gate electrode 5 in the peripheral region B, to form second source and drain regions 6 and 7. Though not shown in the drawing, in the process shown in FIG. 4a, an impurity ion injection process is conducted for an entire surface of the semiconductor substrate 1 for adjusting a cell threshold voltage before the impurity ion injection process for forming the first source and drain regions 2 and 3. The threshold voltage is adjusted to be approx. 0.7 v. Then, as shown in FIG. 4c, a code ion injection process is conducted according to a customer specification. Upon conduction of the ion injection, the threshold voltage of the cell becomes approx. 4.5 v. The aforementioned NOR type mask ROM is operative as a mask ROM by selection of a cell by the gate electrode 5 in the peripheral circuit region B, applying an appropriate value to the wordline 4, sensing the selected cell whether a code ion injected transistor or not, and determining a data. In this instance, in the code ion injection process, boron ions, impurity ions of a conductivity identical to a conductivity with the substrate (or a well if there is a well formed in the substrate), is injected for elevating the threshold voltage of a cell transistor from approx. 0.7 v to approx. 4.5 v, if the cell transistor is an NMOS (N type MOS).

However, the related art mask ROM and a method for fabricating the same have the following problems.

First, the row decoder repeater required for improving a wordline driving capability in an attempt to solve problems of a conductivity drop coming from an increased wordline length due to advanced integration increases a chip size.

Second, fabrication of a mask ROM which is operative at a low voltage and at a fast speed is difficult due to wordline length.

Third, the different source/drain region fabrication processes for the memory cell region and the peripheral circuit region results in a complicated fabrication processes, with a drop of productivity.

SUMMARY OF THE INVENTION

Accordingly, the present invention is directed to a mask ROM and a method for fabricating the same that substantially obviates one or more of the problems due to limitations and disadvantages of the related art.

An object of the present invention is to provide a mask ROM and a method for fabricating the same which is operative at a high speed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the mask ROM includes a semiconductor substrate, a first insulating film formed on the semiconductor substrate, conductive layer patterns formed on the first insulating film, a first, and a second impurity regions formed in the semiconductor substrate on both sides of the conductive layer patterns, a second insulating film formed on the first insulating film inclusive of the conductive layer patterns, a contact hole formed in the second insulating film on the conductive layer patterns, a plug formed in each of the contact holes, and wordlines formed the second insulating film inclusive of the plugs.

In other aspect of the present invention, there is provided a method for fabricating a mask ROM, including the steps of (1) providing a semiconductor substrate, (2) forming first, and second impurity regions alternatively in the semiconductor substrate, (3) forming a first insulating film on an entire surface of the semiconductor substrate, (4) forming a plurality of conductive layer patterns on the first insulating film between the first, and second impurity regions, (5) forming a second insulating film on an entire surface of the first insulating film inclusive of the conductive layer patterns, (6) forming contact holes in the second insulating film on the conductive layer patterns, (7) forming plugs in the contact holes, and (8) forming wordlines each having a width the same with the conductive layer pattern in a direction crossing the first, and second impurity regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 5:
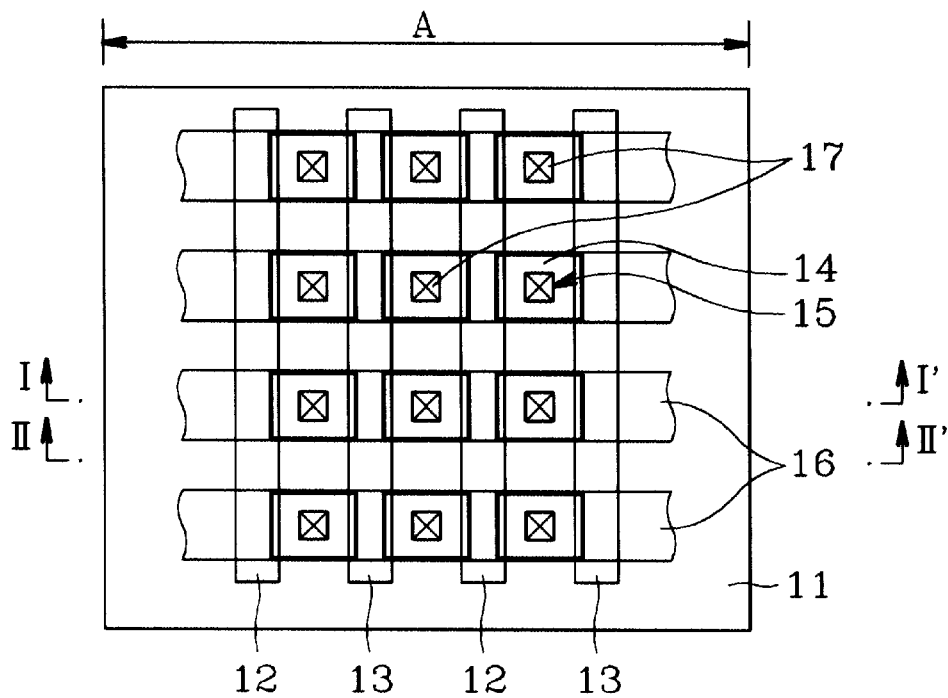
FIG. 5 illustrates a layout of a mask ROM in accordance with a first preferred embodiment of the present invention.

Reference will now be made in detail to the preferred embodiments of the present invention, examples of which are illustrated in the accompanying drawings. FIG. 5 illustrates a layout of a mask ROM in accordance with a first preferred embodiment of the present invention, FIG. 6 illustrates a section across line I–I' in FIG. 5, and FIG. 7 illustrates a section across line II–II' in FIG. 5.

Figure 1:
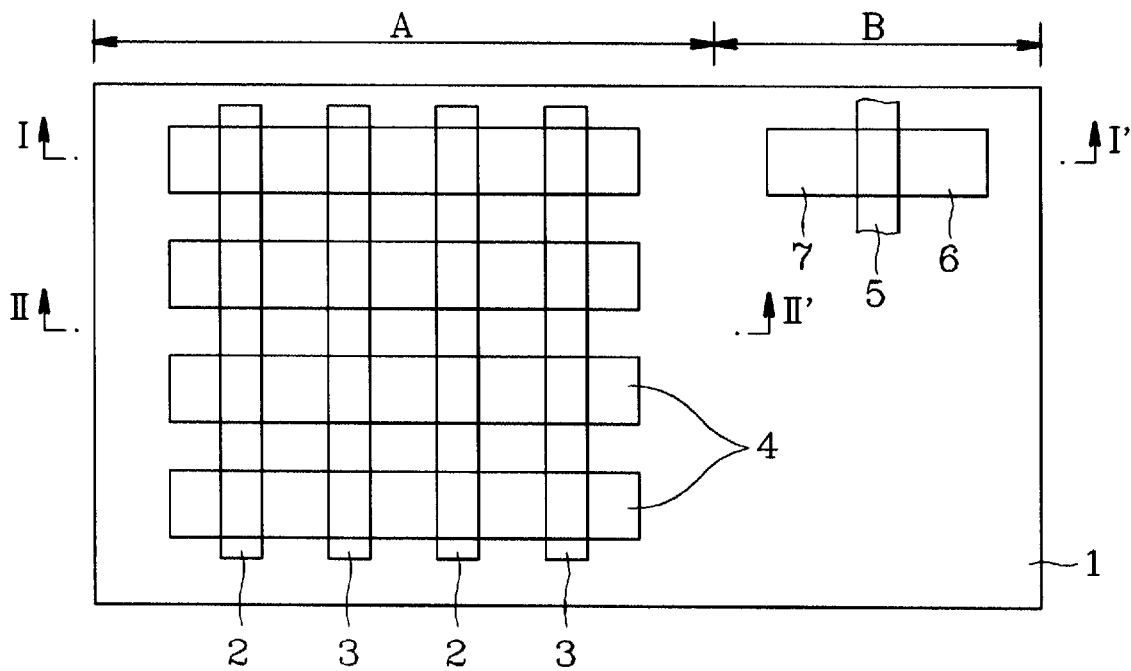
FIG. 1 illustrates a layout of a related art mask ROM.
Figure 2:
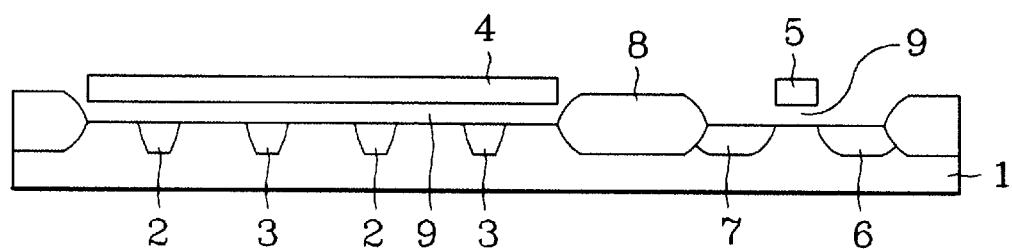
FIG. 2 illustrates a section across line I–I' in FIG. 1.
Figure 3:
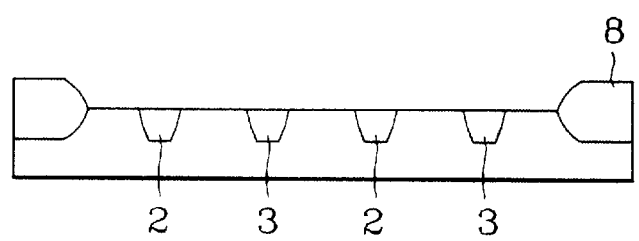
FIG. 3 illustrates a section across line II–II' in FIG. 1.
Figure 4A:
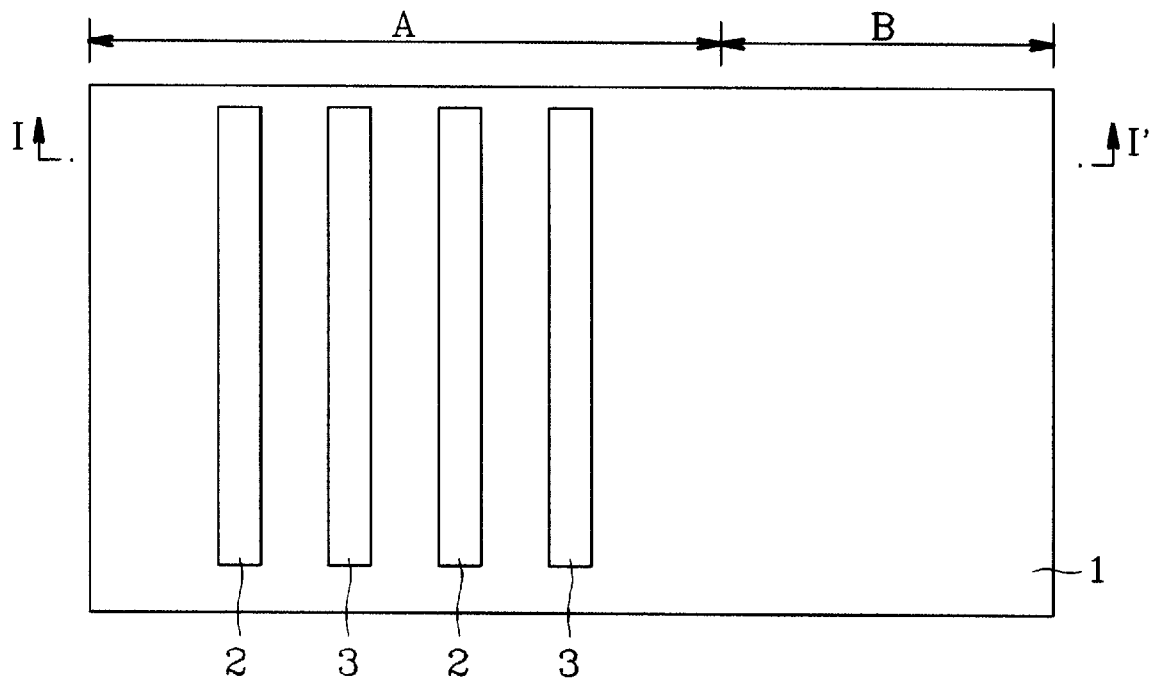
FIGS. 4a~4c illustrate layouts of FIG. 1 and sections across lines I–I' of the layouts showing the steps of a fabricating method.
Figure 4A:
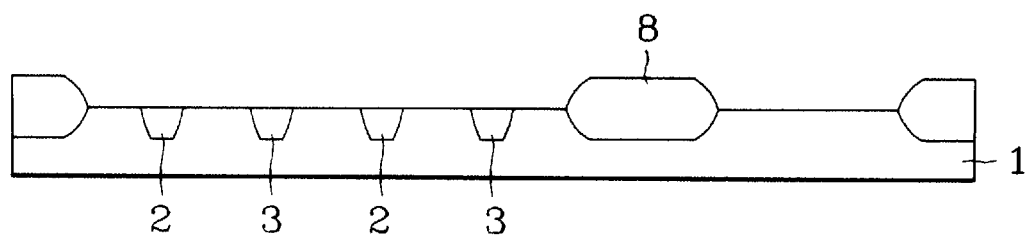
Figure 4B:
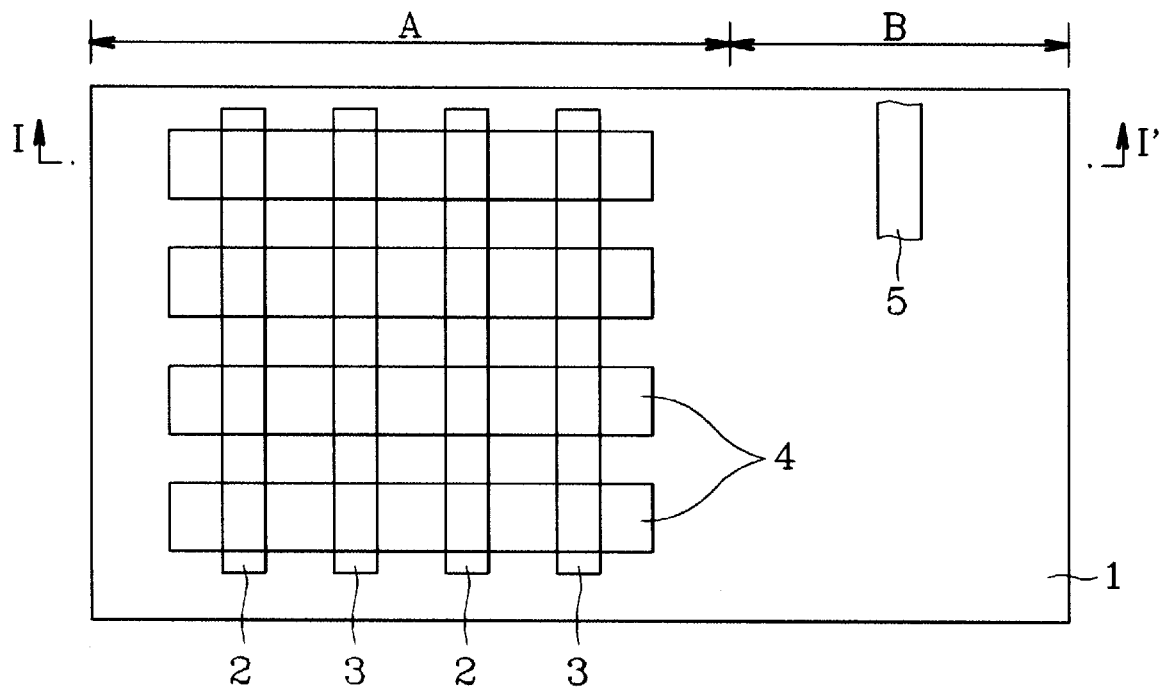
Figure 4B:
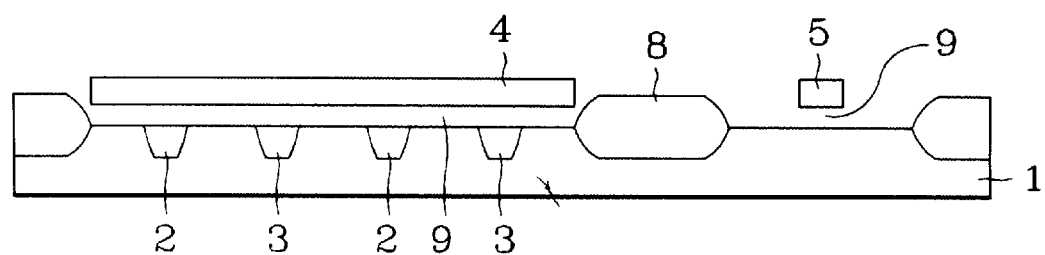
Figure 4C:
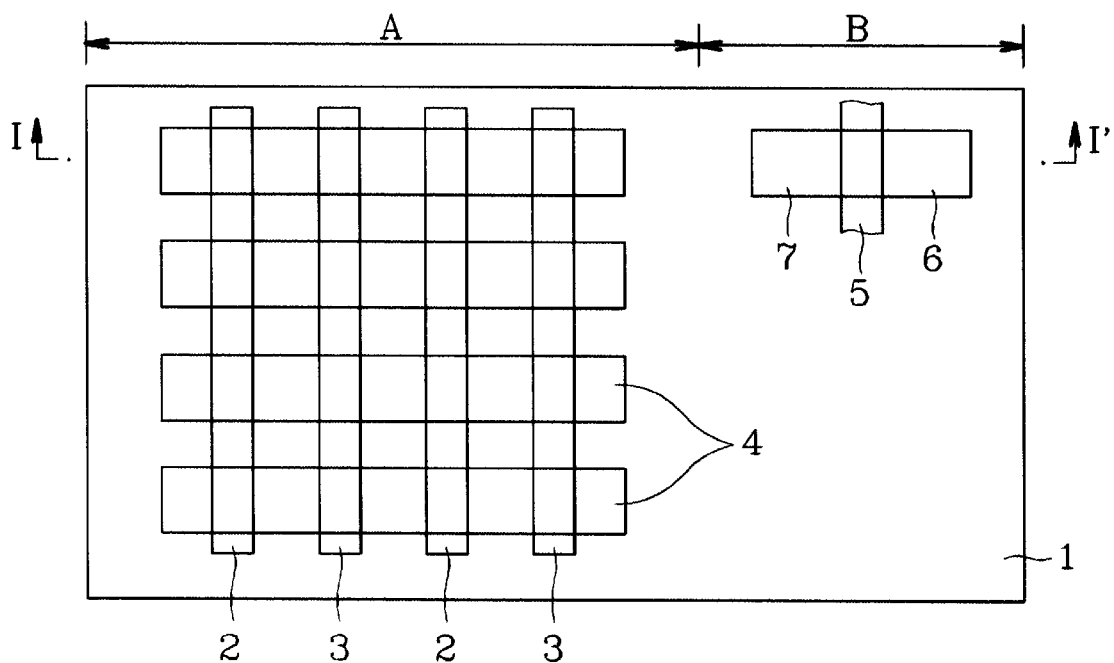
Figure 4C:
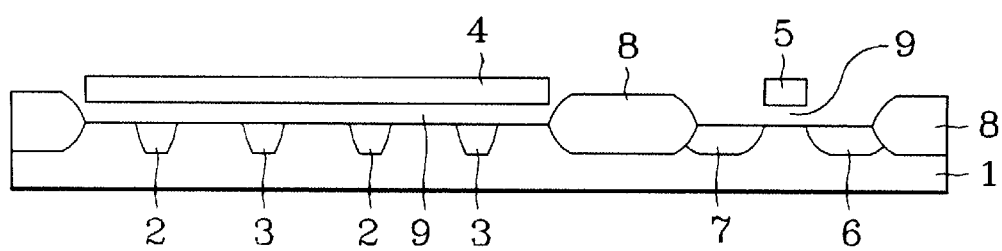

Referring to FIGS. 1~3, a peripheral circuit region of the mask ROM in accordance with a first preferred embodiment of the present invention has a system identical to the peripheral circuit region (B in FIG. 1) of the related art mask ROM, of which explanation will be omitted, and a memory cell region will be explained.

Figure 6:
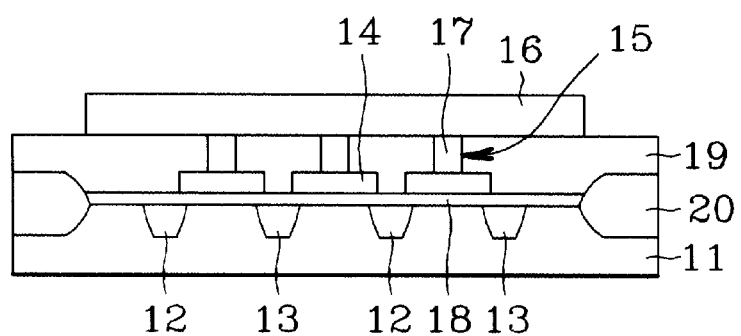
FIG. 6 illustrates a section across line I–I' in FIG. 5.
Figure 7:
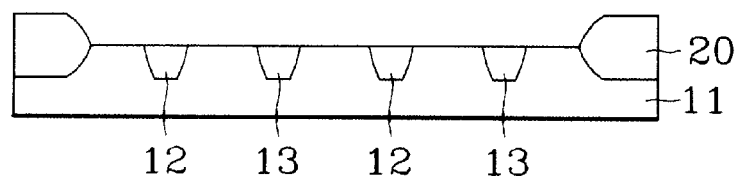
FIG. 7 illustrates a section across line II–II' in FIG. 5.

Referring to FIGS. 5~7, the mask ROM in accordance with a first preferred embodiment of the present invention includes a semiconductor substrate 11, a first insulating film 18 formed on the semiconductor substrate 11, a conductive layer pattern 14 formed on the first insulating film 18, a first, and a second impurity regions 12 and 13 formed in the semiconductor substrate 11 on both sides of the conductive layer pattern 14, a second insulating film 19 formed on the first insulating film 18 inclusive of the conductive layer pattern 14, a contact hole 15 formed in the second insulating film 19 on the conductive layer pattern 14, a plug 17 formed in the contact hole 15, and wordlines 16 formed the second insulating film 19 inclusive of the plug 17. The first, and second impurity regions 12 and 13 are formed beneath surfaces of the semiconductor substrate 11 in one direction at fixed intervals. The wordlines 16 are formed in one direction crossed with the first, and second impurity regions 12 and 13 at fixed intervals, and the conductive layer patterns 14 are formed under the wordlines 16. The conductive layer patterns 14 are formed at fixed intervals both in a vertical and horizontal directions like islands with both side edges overlapped with the first and second impurity regions 12 and 13. The contact hole 15 is formed in a central portion of the conductive layer pattern 14 in a size smaller than the conductive layer pattern 14. The unexplained reference number 20 denotes an isolating insulating film. The first, and second insulating films 18 and 19 are formed of either oxide or nitride. The conductive layer patterns 14 are formed of polysilicon, and the wordlines 16 are formed of a refractory metal, or a refractory metal silicide. Beside the polysilicon, the conductive layer patterns 14 may also be formed of one or more than one selected from refractory metals and refractory metal silicides. A bottom portion of the conductive layer pattern 14 is used as a channel region. The refractory metal includes tungsten W, titanium Ti, and tantalum Ta, and the refractory metal silicide includes a tungsten silicide $WSi_2$ (resistivity about 100 $\mu\Omega\cdot cm$), titanium silicide $TiSi_2$ (resistivity below 20 $\mu\Omega\cdot cm$), tantalum silicide $TaSi_2$ (resistivity below 20 $\mu\Omega\cdot cm$), and cobalt silicide $CoSi_2$ (resistivity below 20 $\mu\Omega\cdot cm$). The plug is formed of a conductive material (for example, tungsten) and may be formed of a material identical to the wordlines.

FIGS. 8a~8d illustrate layouts of FIG. 5 and sections across lines I–I' of the layouts showing the steps of a fabricating method.

Figure 8A:
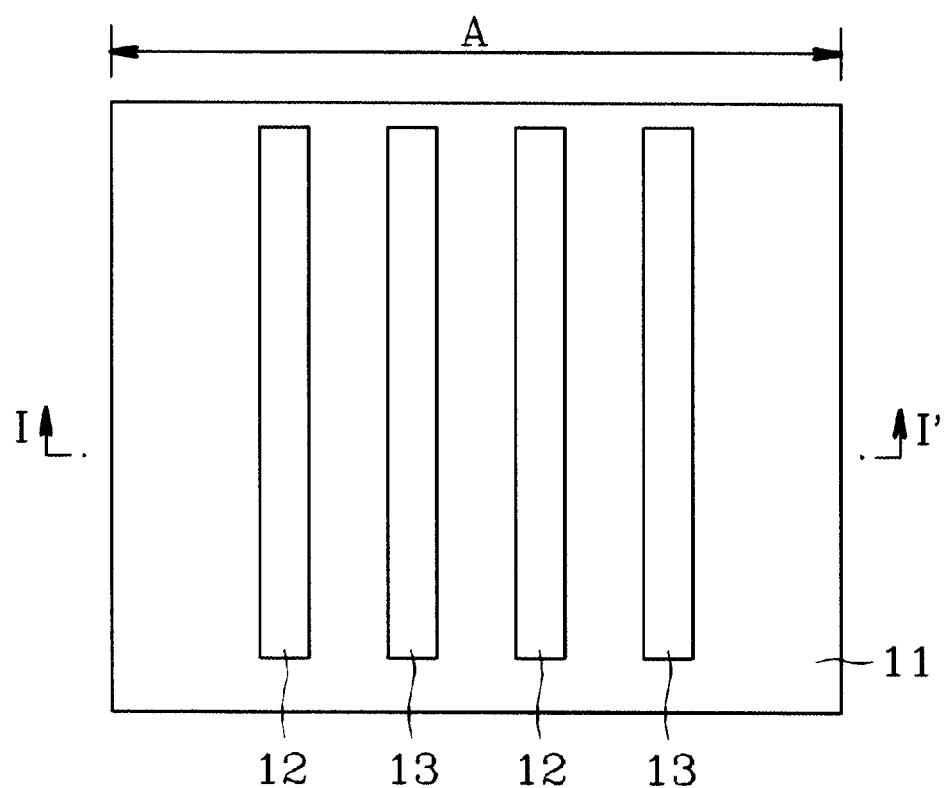
FIGS. 8a~8d illustrate layouts of FIG. 5 and sections across lines I–I' of the layouts showing the steps of a fabricating method.
Figure 8A:
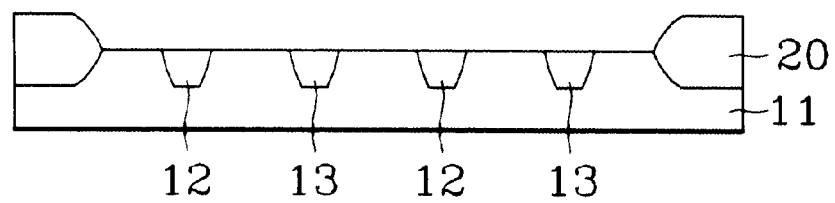
Figure 8B:
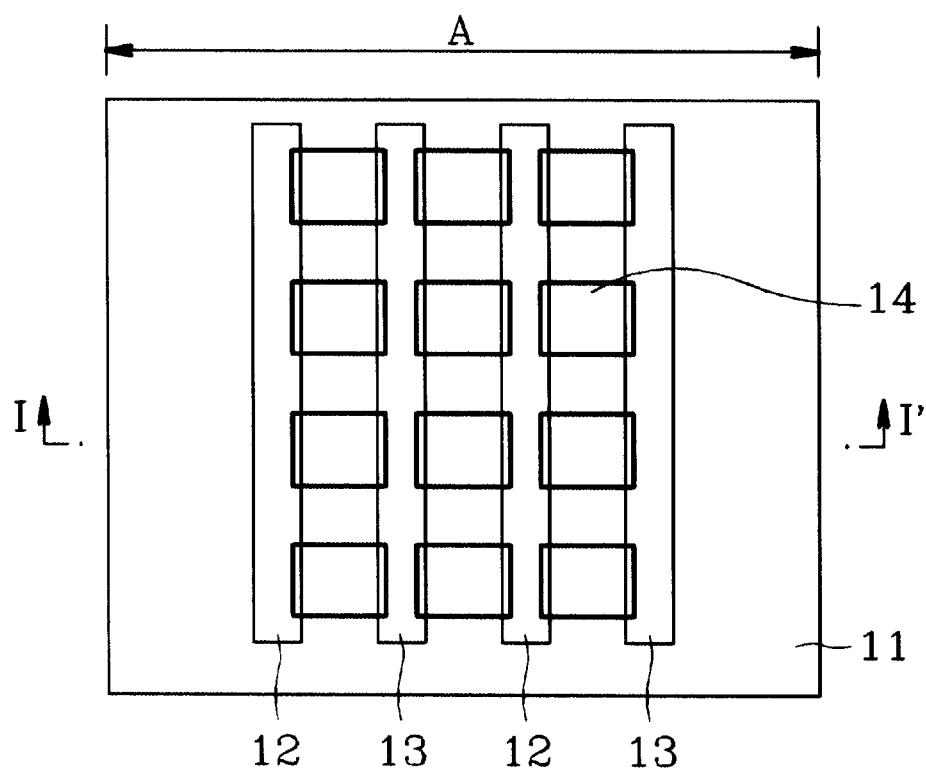
Figure 8B:
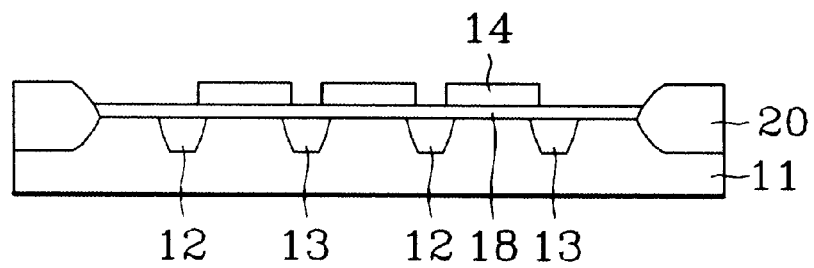
Figure 8C:
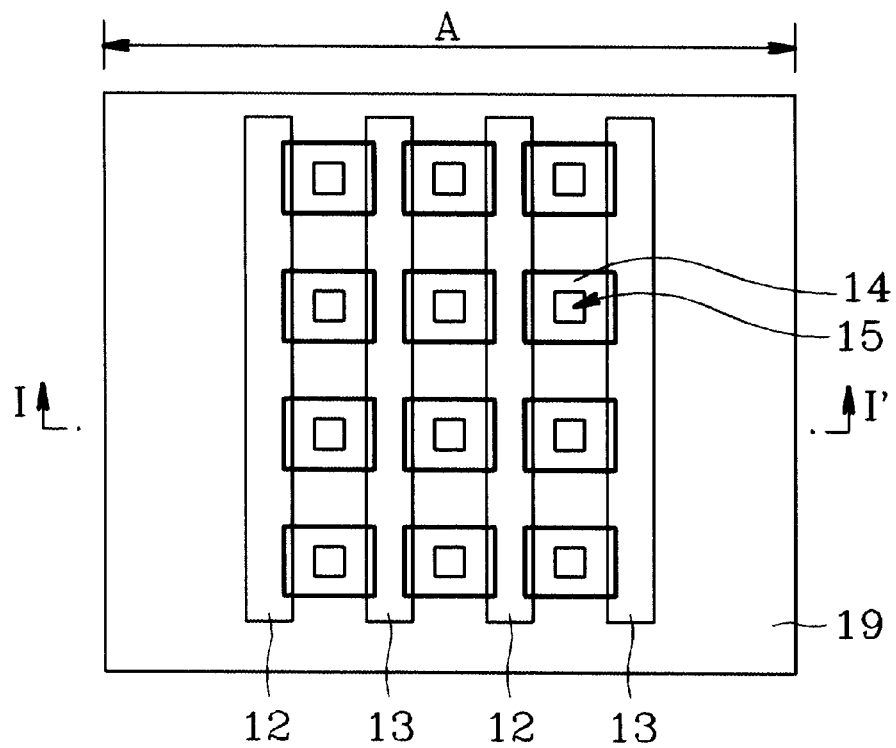
Figure 8C:
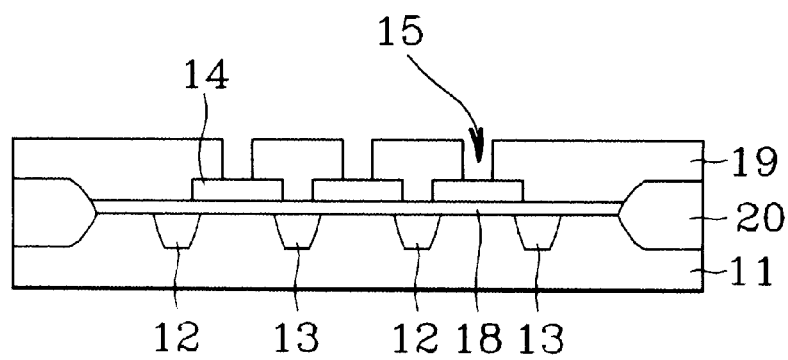
Figure 8D:
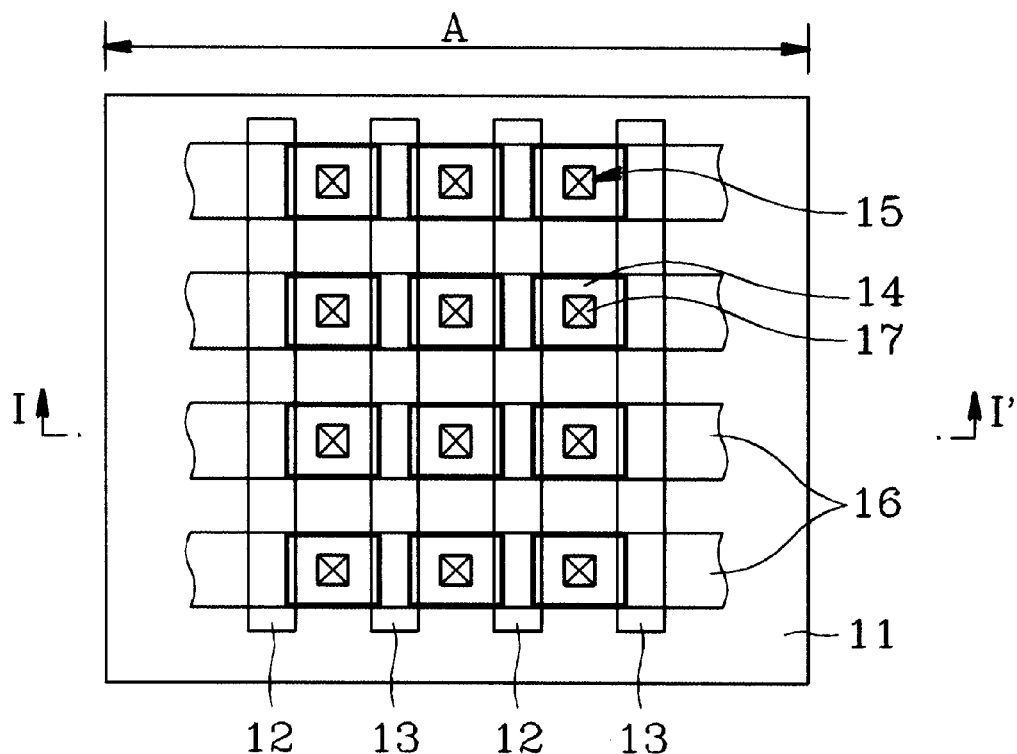
Figure 8D:
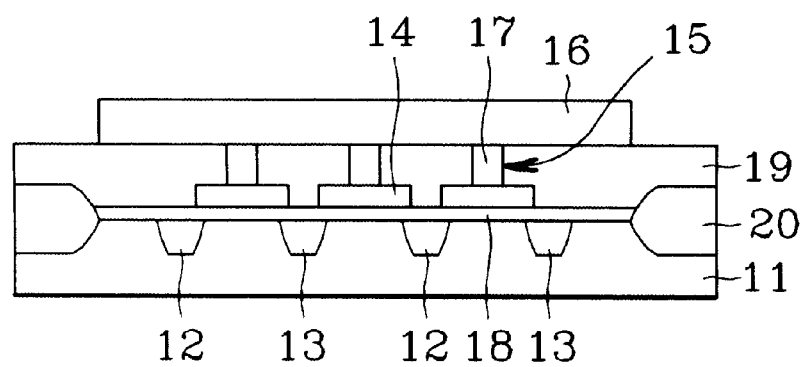

Referring to FIG. 8a, the fabricating method starts with selectively injecting impurity ions of a conductivity opposite to a semiconductor substrate 11 into the semiconductor substrate 11 having a memory cell region A defined thereon, to form first, and second impurity regions 12 and 13 alternatively in one direction at fixed intervals. The first, and second impurity regions 12 and 13 are source/drain regions. And, the drain regions are bitlines. The unexplained reference number 20 denotes an isolating insulating film. As shown in FIG. 8b, a first insulating film 18 is formed on the semiconductor substrate 11, and a conductive layer pattern is formed on the first insulating film 18 and subjected to selective patterning (photolithography+etching), to form a conductive pattern 14. In this instance, the conductive layer pattern 14 is formed on the first insulating film 18 between the first, and second impurity regions 12 and 13 with both edges thereof overlapped with the first, and second impurity regions 12 and 13 at fixed intervals in vertical and horizontal directions, i.e., in a matrix of islands. The first insulating film 18 is formed of one or more than one selected from oxide films and nitride films, and the conductive layer patterns 14 may be formed of polysilicon. Beside the polysilicon, the conductive layer patterns 14 may also be formed of one or more than one selected from refractory metals and refractory metal silicides. The refractory metal includes tungsten W, titanium Ti, and tantalum Ta, and the refractory metal silicide includes a tungsten silicide $WSi_2$, titanium silicide $TiSi_2$, tantalum silicide $TaSi_2$, and cobalt silicide $CoSi_2$. As shown in FIG. 8c, a second insulating film 19 is formed on an entire surface inclusive of the conductive layer pattern 14 and subjected to selective patterning (photolithography+ etching) to form contact holes 15 therein. In this instance, the contact hole 15 is formed in a central portion of the conductive layer pattern 14 with a size smaller than the conductive layer pattern 14. The second insulating film 19 is formed of one or more than one selected from oxide films and nitride films. As shown in FIG. 8d, a plug 17 is formed of a conductive material in the contact hole 15. Then, a second conductive layer is formed on the second insulating film 19 inclusive of the plug 17, wordline region are defined thereon, and the second conductive layer is subjected to patterning to leave the second conductive layer in the wordline regions, to form the wordlines 16. In this instance, the wordline formed to have a width identical to a width of the conductive layer pattern 14 in a direction crossing the first, and second impurity regions 12 and 13. In this instance, both the plug 17 and the wordline 16 may be formed by one time deposition; the second conductive layer is formed both in the contact hole 15 and on the second insulting film 19, wordline regions are defined thereon, and the second conductive layer is subjected to patterning (photolithography+ etching). The plug 17 is formed of a conductive material (for example, tungsten W). And, the wordline 16 is formed of a refractory metal, or a refractory metal silicide. The refractory metal includes tungsten, titanium, and tantalum, and the refractory metal silicide includes a tungsten silicide $WSi_2$, titanium silicide $TiSi_2$, tantalum silicide $TaSi_2$, and cobalt silicide $CoSi_2$. A resistivity per unit area of the refractory metal or refractory metal silicide is 0.1 $\mu/\square$. Eventually, a conductivity of the wordline can be improved than a case when the wordline is formed of polysilicon (resistivity higher than 6~7Ω). In the aforementioned mask ROM and the method for fabricating the same in accordance with the first embodiment of the present invention, the conductive layer pattern 14 is preferably formed of polysilicon and the wordline 16 is preferably formed of a material containing a refractory metal. Formation of the conductive layer pattern 14 of polysilicon simplifies the fabrication process, and formation of a member in contact with the conductive layer pattern 14 through the plug 16 on the conductive layer pattern 14 of a material containing a refractory metal (containing a refractory metal silicide) improves a conductivity.

Figure 9:
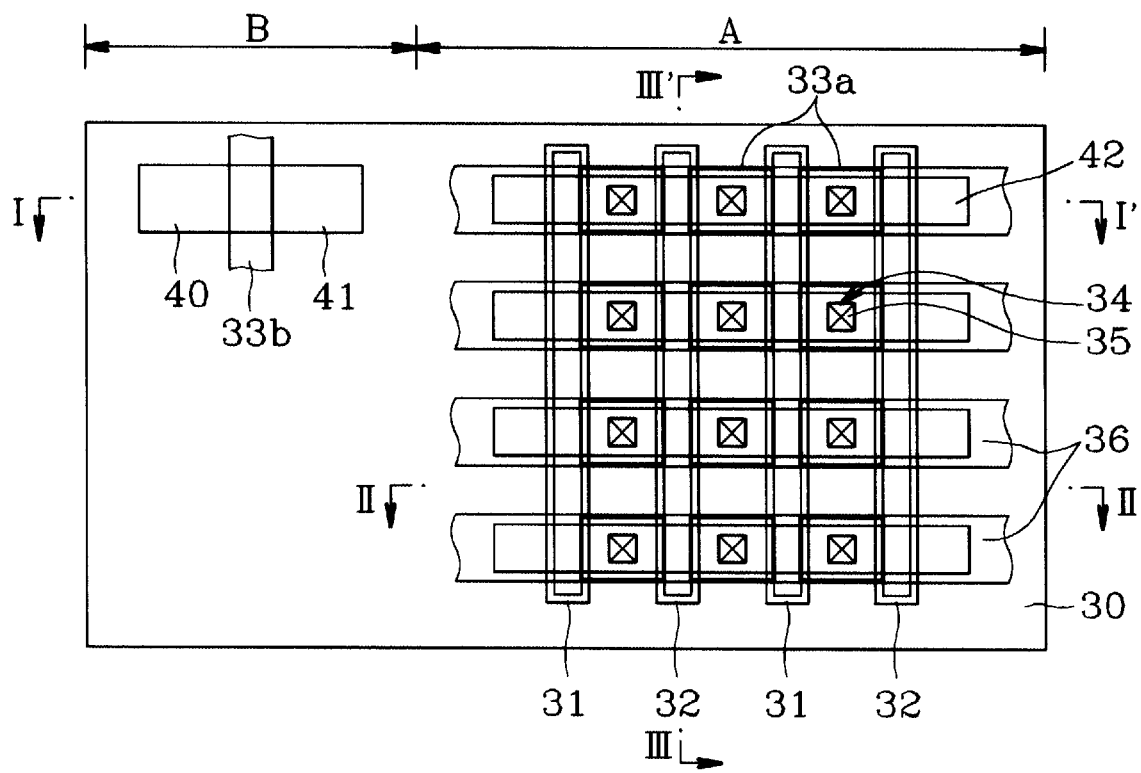
FIG. 9 illustrates a layout of a mask ROM in accordance with a second preferred embodiment of the present invention.
Figure 10:
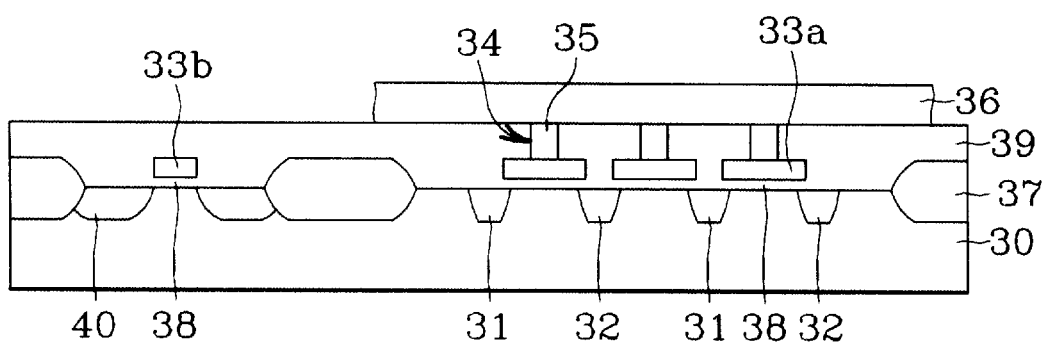
FIG. 10 illustrates a section across line I–I' in FIG. 9.
Figure 11:
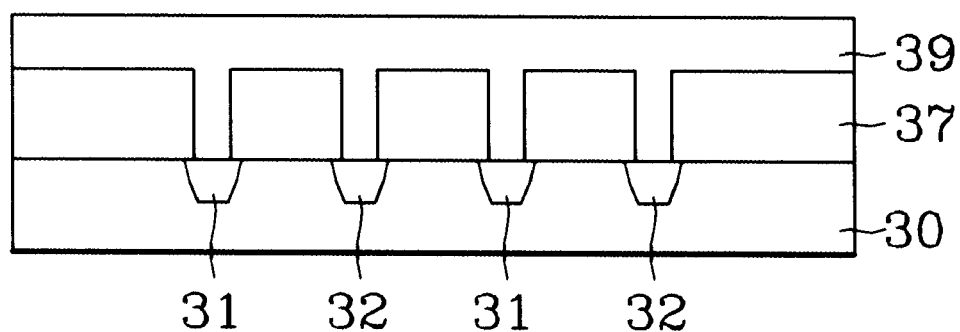
FIG. 11 illustrates a section across line II–II' in FIG. 9.
Figure 12:
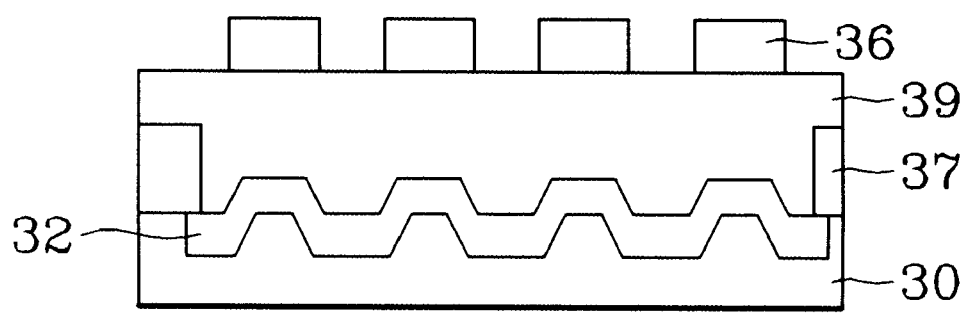
FIG. 12 illustrates a section across line III–III' in FIG. 9.

FIG. 9 illustrates a layout of a mask ROM in accordance with a second preferred embodiment of the present invention, FIG. 10 illustrates a section across line I–I' in FIG. 9, FIG. 11 illustrates a section across line II–II' in FIG. 9, and FIG. 12 illustrates a section across line III–III' in FIG. 9.

Referring to FIGS. 9~12, the mask ROM in accordance with a second preferred embodiment of the present invention includes a semiconductor substrate 30 having a memory cell region A and a peripheral circuit region B defined thereon, a plurality of active regions 42 defined in the memory cell region A in one direction at fixed intervals, a plurality of conductive layer patterns 33a formed on the active regions 42 at fixed intervals in vertical and horizontal directions, and a gate electrode 33b formed in the peripheral circuit region B, a first of first, and second impurity regions 31 and 32 formed alternatively in the semiconductor substrate 30 at portions between the conductive layer patterns 33a in a direction vertical to the active regions 42, a second of the first, and second impurity regions 40 and 41 formed in the semiconductor substrate 30 on both sides of the gate electrode 33b, isolating insulating films 37 formed on the semiconductor substrate 31 between the active regions 42 and the first of the first and second impurity regions 31 and 32, an insulating film 39 formed on an entire surface of the substrate inclusive of the conductive layer pattern 33a and the gate electrode 33b, contact holes 34 formed in the insulating film 39 on the conductive layer pattern 33a, plugs 35 formed in each of the contact holes 34, and plurality of wordlines 36 formed on the insulating film 39 inclusive of the plugs 35 in the active regions 42. There is a gate insulating film 38 formed under the conductive layer pattern 33a and the gate electrode 33b between the conductive layer pattern 33a and the gate electrode 33b and the substrate 30. The gate insulating film 38 includes one or more than one selected from oxide films and nitride films having an etch selectivity the same with the isolating insulating film 37. And, the insulating film 39 is also formed of one or more than one selected from oxide films and nitride films. The first of first, and second impurity regions 31 and 32 are source, and drain regions, of which drain regions are bitlines. The second of the first, and second impurity regions 40 and 41 are also source/drain regions. The conductive layer patterns 33a are formed of one or more than one selected from polysilicon, refractory metals, and refractory metal silicides, and the wordlines 36 are formed of one of refractory metals and refractory metal silicides. The refractory metals and refractory metal silicides are inclusive of tungsten, titanium, and tantalum. The gate electrode 33b is also formed of one or more than one selected from polysilicon, refractory metals, and refractory metal silicides. And, the plug 35 is formed of a conductive material, identical to the wordline 36.

FIGS. 13a~13f illustrate layouts of FIG. 9 and sections across lines I–I', II–II', and III–III' of the layouts showing the steps of a fabricating method.

Figure 13A:
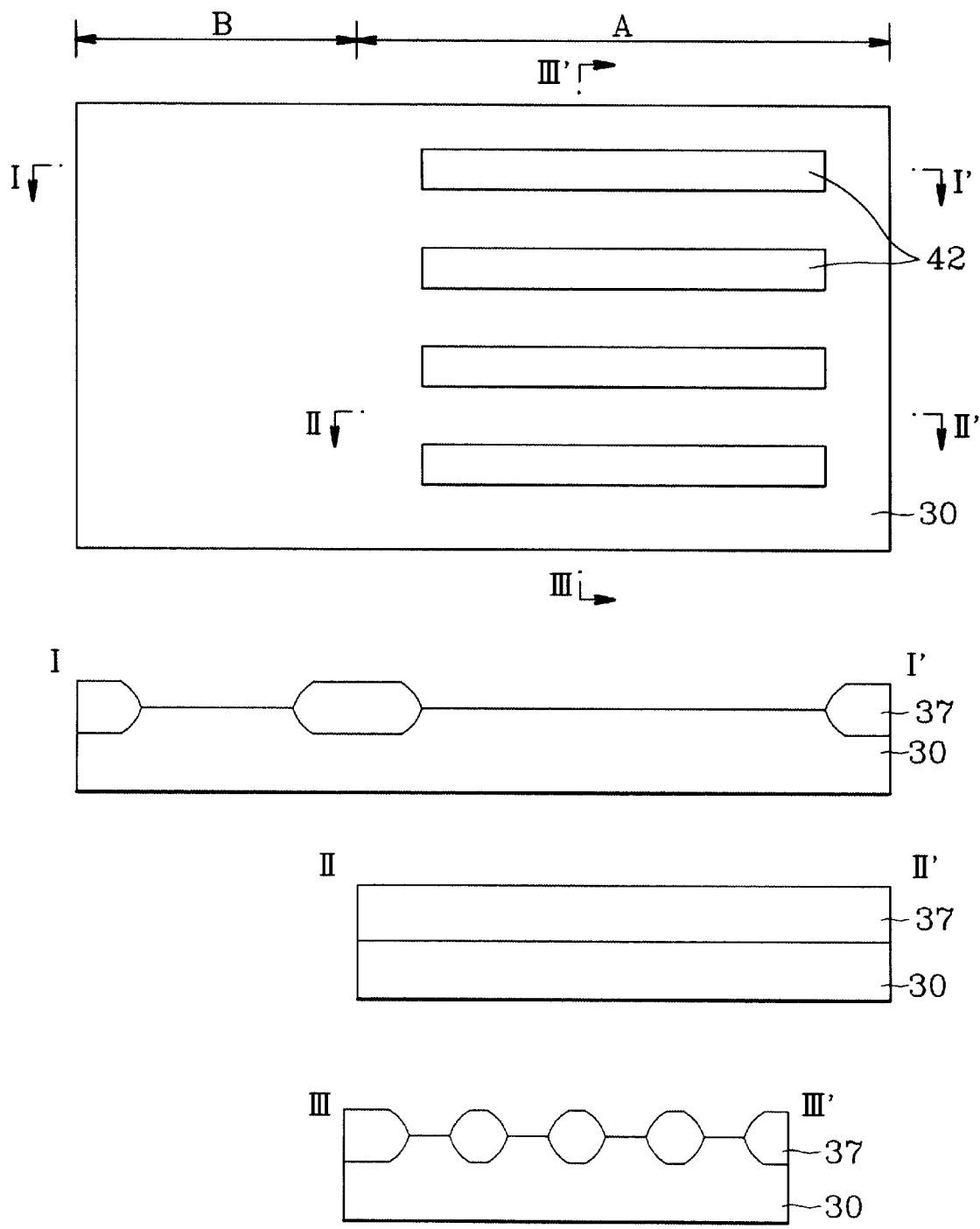
FIGS. 13a~13f illustrate layouts of FIG. 9 and sections across lines I–I', II–II', and III–III' of the layouts showing the steps of a fabricating method.

Referring to FIG. 13a, the steps of a fabricating method starts with forming isolating insulating films 37 by a general field oxide film formation process such that active regions 42 are defined at fixed intervals in one direction in a semiconductor substrate 30 having a memory cell region A and a peripheral circuit region B. Then, impurity ions are injected (not shown) for adjusting a threshold voltage ($V_T$).

Figure 13B:
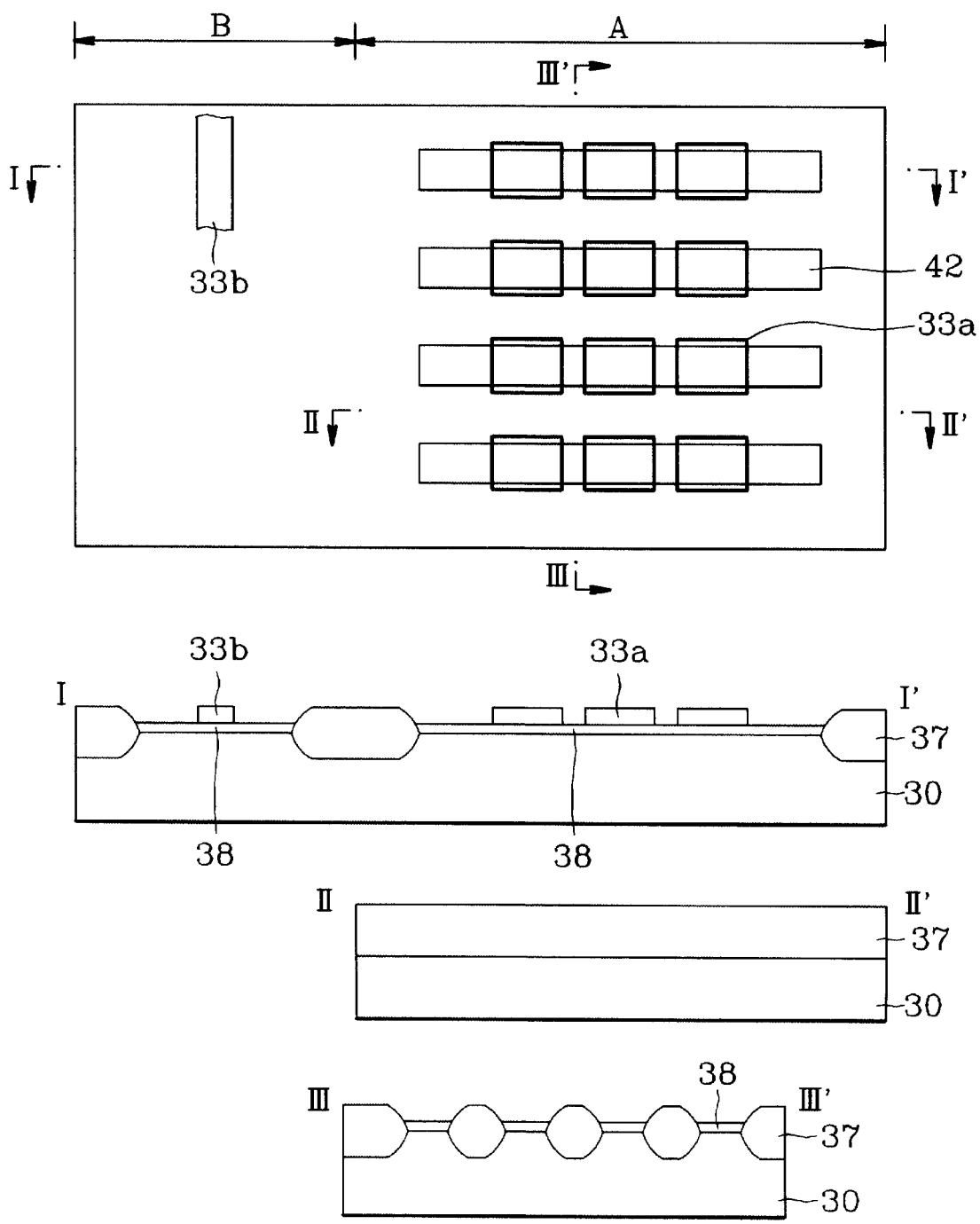
Figure 13C:
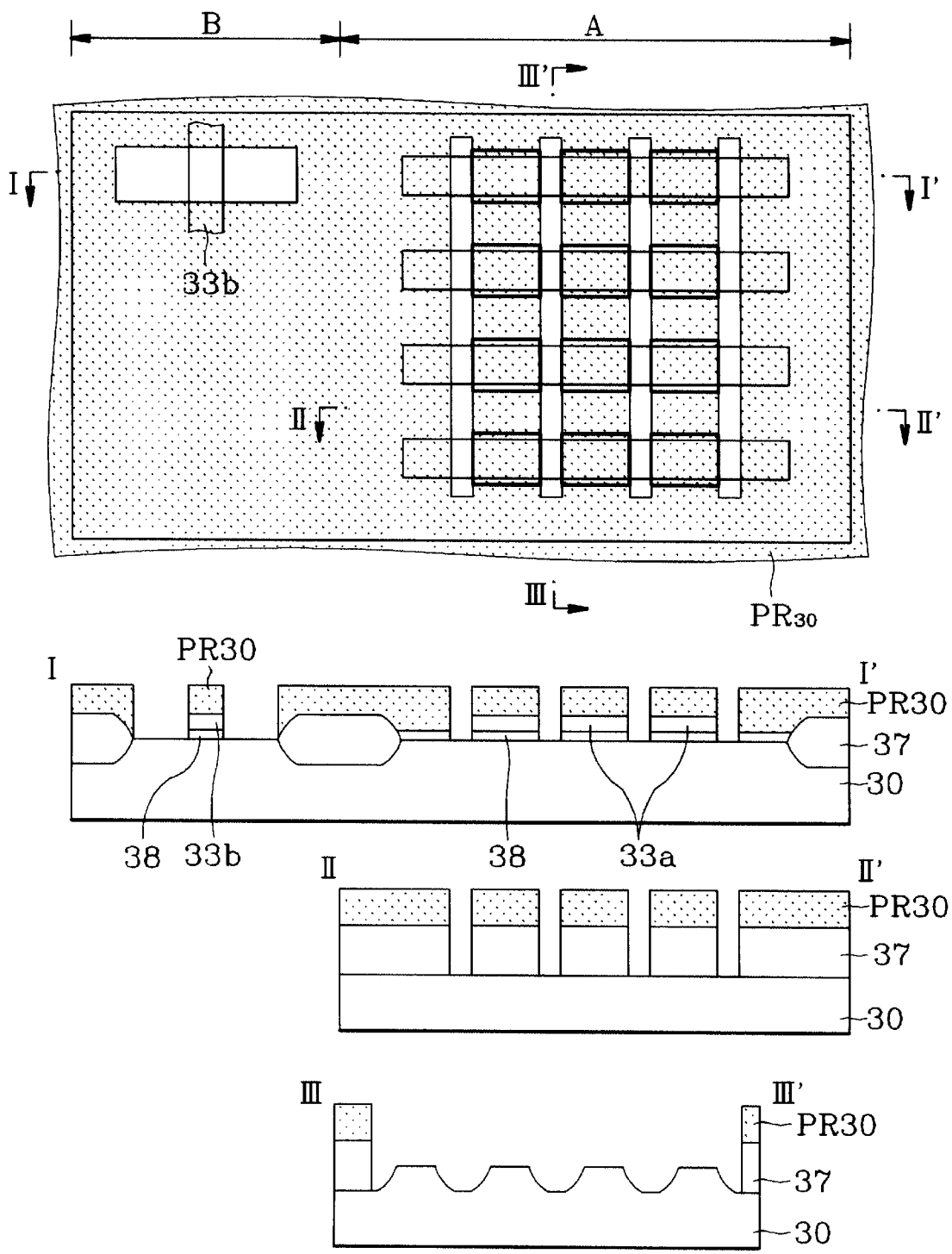
Figure 13D:
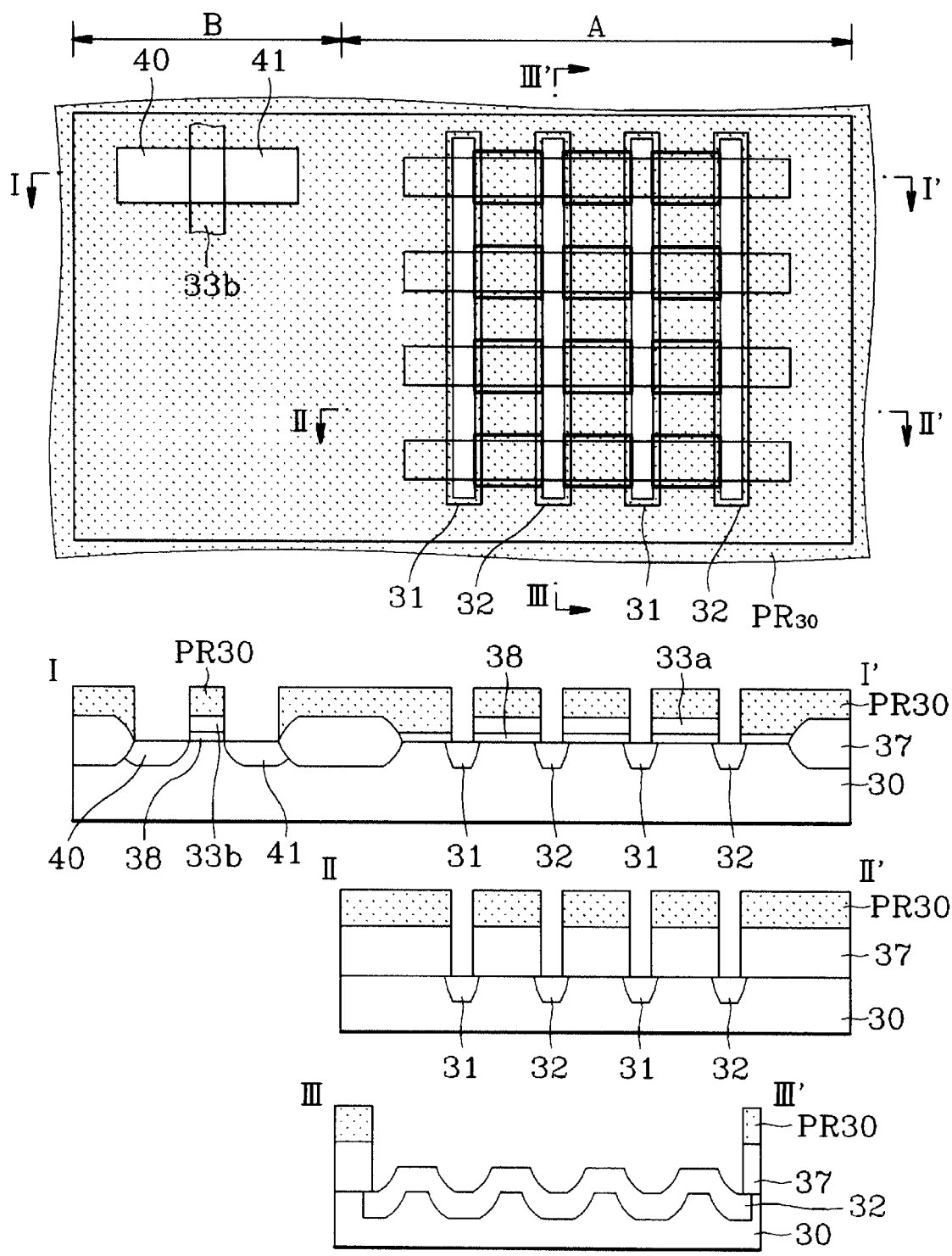
Figure 13E:
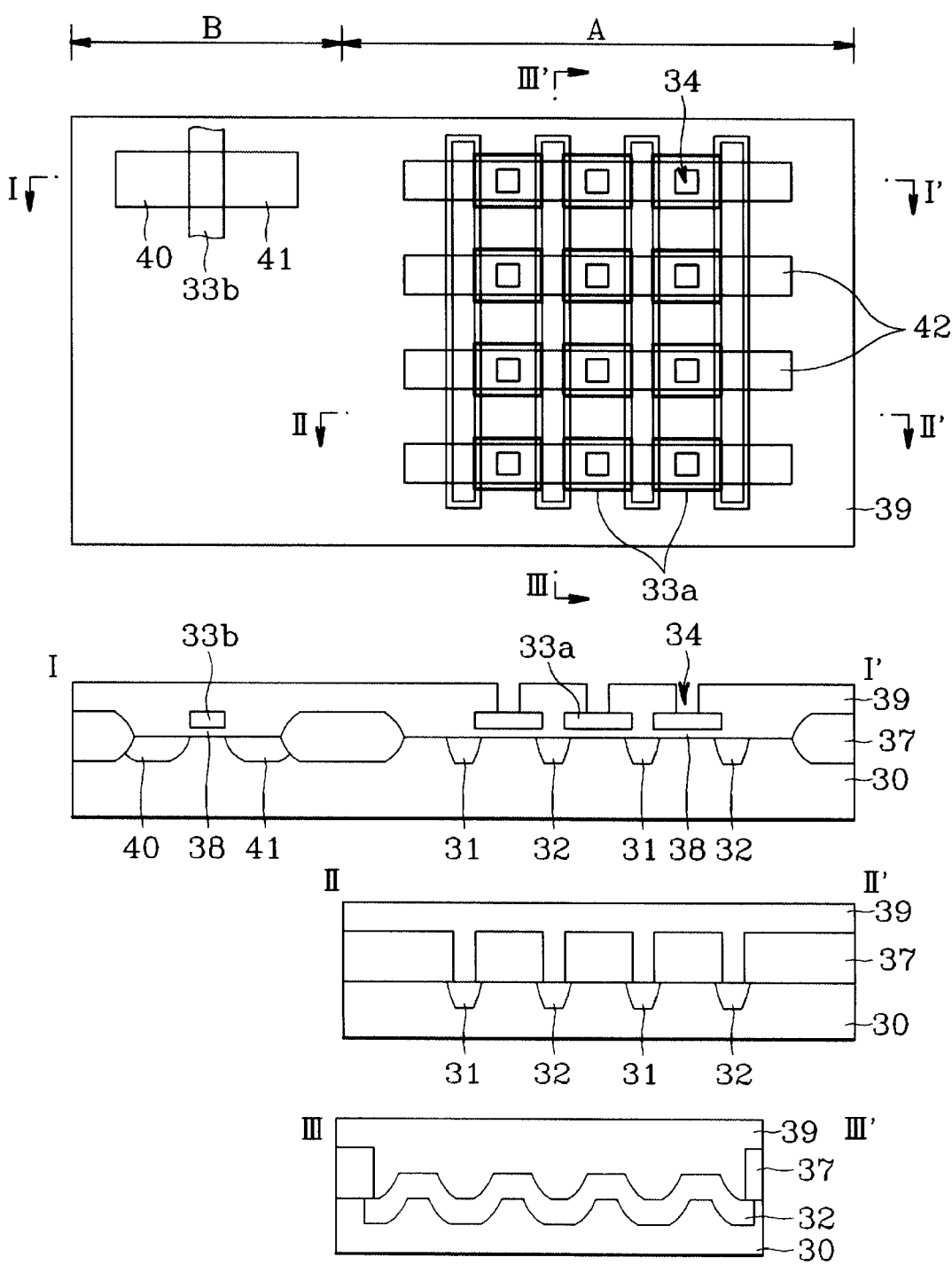
Figure 13F:
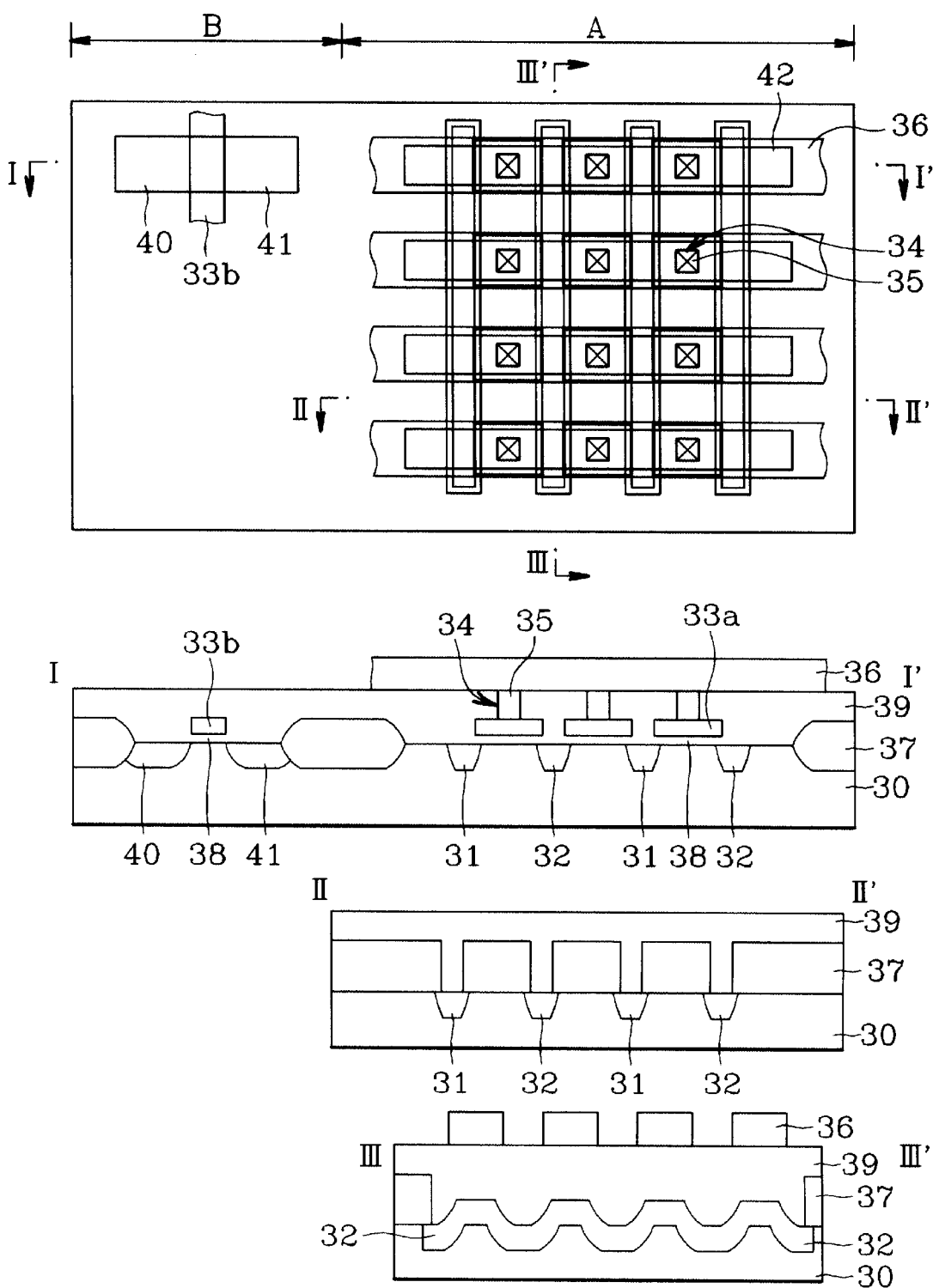

As shown in FIG. 13b, a gate insulating film 38 is formed on the semiconductor substrate 30, and a conductive layer is formed on an entire surface of the substrate inclusive of the gate insulating film 38. After conductive pattern regions are defined on the conductive layer, the conductive layer is subjected to selective patterning (photolithography+etching) to leave the conductive layer only in the conductive layer pattern regions, so that conductive layer patterns 33a are formed at fixed intervals in vertical and horizontal directions in the active regions 42 in the memory cell region A and a line form of gate electrode 33b in the peripheral circuit region B. Portions of the semiconductor substrate 30 under the conductive layer patterns 33a are channel regions. The gate insulating film 38 is formed of a material having the same etch selectivity with the isolating insulating film 37, and the conductive layer patterns 33a and the gate electrode 33b are formed of one or more than one selected from polysilicon, refractory metals, and refractory metal silicides. As shown in FIG. 13c, a photoresist film $PR_{30}$ is coated on an entire surface of the substrate inclusive of the conductive layer pattern 33a and the gate electrode 33b, and subjected to patterning by exposure and development such that the photoresist film $PR_{30}$ is removed in line forms from portions between the conductive layer patterns 33a in a direction vertical to the active regions 42 in the memory cell region A and the photoresist film $PR_{30}$ is removed from portions on both sides of the peripheral circuit regions B. Then, the patterned photoresist film $PR_{30}$ is used in etching the gate insulating film 38 to remove the gate insulating film 38 on both sides of the conductive layer patterns 33a and both sides of the gate electrode 33b. In this instance, the isolating insulating films 37 between the active regions 42 are also etched due to the patterned line forms of photoresist film $PR_{30}$ because etch selectivities of the gate insulating film 38 and the isolating insulating films 37 are the same. At the end, surfaces of the semiconductor substrate 30 in a direction vertical to the active regions 42 are exposed. As shown in FIG. 13d, impurity ions of a conductivity opposite to a conductivity of the substrate are injected into the surfaces of the semiconductor substrate 30 exposed in a direction vertical to the active regions 42, so that a first of first, and second impurity regions 31 and 33 are formed alternatively in the surface of the semiconductor substrate 30 exposed in a vertical direction on both sides of the conductive layer patterns 33a in the memory cell region A and a second or the first, and second impurity regions 40 and 41 are formed on both sides of the gate electrode 33b in the memory cell region B. The first of the first, and second impurity regions 31 and 33 and the second of the first, and second impurity regions 40 and 41 are source and drain regions. The first of the second impurity regions 32 are both drain regions and bitlines. Eventually, the first of the second impurity regions 31 and 32 are formed in the semiconductor substrate 30 in a direction vertical to the active regions 42. Then, though not shown in the drawings, the photoresist film $PR_{30}$ is removed, and a code impurity ions are selectively injected into the semiconductor substrate 30 (to used as a channel region) under the conductive layer patterns 33a in the memory cell region A according to a customer specification, to program the mask ROM. As shown in FIG. 13e, an insulating film 39 is formed on an entire surface of the substrate inclusive of the conductive layer pattern 33a and the gate electrode 33b, and the insulating film 39 on the conductive layer patterns 33a are subjected to selective patterning (photolithography+etching), to form contact holes 34 therein. The contact hole 34 is formed in a central portion of the conductive layer pattern 33a in a size smaller than the conductive layer pattern 33a. The insulating film 39 is formed of one or more than one selected from oxide films and nitride films. As shown in FIG. 13f, a plug 35 of a conductive material is formed in the contact hole 34. Then, a conductive layer is formed on the insulating film 39 inclusive of the plugs 35, wordline regions are defined on the conductive layer, and the conductive layer is patterned to leave the conductive layer only in the wordline regions, to form the wordlines 36. In this instance, the wordline 36 may be formed of a width the same with the conductive layer pattern 33a in a direction the same with the active regions 42. Since processes and materials for forming such plugs 35 and the wordlines 36 are the same with the first embodiment, the explanations are omitted.

The mask ROM and the method for fabricating the same of the present invention have the following advantages.

First, despite of a length increase of the wordlines according to the advancement of high density device integration in the mask ROM, the formation of wordlines of a material containing a refractory metal which has a low resistivity per unit area allows to improve a conductivity without the row decoder repeaters and a reduction of a chip size, thereby providing a mask ROM and a method for fabricating the same, which can be integrated highly.

Second, a mask ROM and a method for fabricating the same, which is operative at a low voltage and a high speed, are made available.

Third, the ion injection process is made simple as the ion injection into the memory cell region and the peripheral circuit region for forming source/drain regions therein can be done at one time.

It will be apparent to those skilled in the art that various modifications and variations can be made in the mask ROM and a method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a mask ROM, comprising:
   providing a semiconductor substrate;
   forming first and second impurity regions alternatively in the semiconductor substrate, wherein the first and second impurity regions extend along a first direction in the semiconductor substrate;
   forming a first insulating film on an entire surface of the semiconductor substrate;
   forming a plurality of conductive layer patterns on the first insulating film between the first and second impurity regions;
   forming a second insulating film on an entire surface of the first insulating film inclusive of the conductive layer patterns;
   forming contact holes in the second insulating film on the conductive layer patterns;
   forming plugs in the contact holes; and,
   forming wordlines, wherein each wordline has a width which is the same width as the conductive layer pattern in the first direction, wherein the wordlines extend in a second direction crossing the first and second impurity regions.

2. A method as claimed in claim 1, wherein the first and second impurity regions are source and drain regions.

3. A method as claimed in claim 1, wherein the conductive layer patterns are formed on the first insulating film at fixed intervals in vertical and horizontal directions on the semiconductor substrate, with both edges thereof overlapped with the first and second impurity regions.

4. A method as claimed in claim 1, wherein the conductive layer is formed on the first insulating film between the first and second impurity regions with both edges overlapping the first and second impurity regions at fixed intervals in vertical and horizontal directions.

5. A method as claimed in claim 1, wherein the first and second insulating films comprise one or more of an oxide film and a nitride film.

6. A method as claimed in claim 1, wherein the conductive layer patterns are formed of one or more material selected from polysilicon, refractory metals, and refractory metal silicides, and the wordlines comprise refractory metals or refractory metal silicides.

7. A method as claimed in claim 1, wherein the conductive layer patterns are formed of polysilicon, and the wordlines comprise tungsten, titanium, tantalum, tungsten silicide, titanium silicide, tantalum silicide, or cobalt silicide.

8. A method as claimed in claim 6, wherein the refractory metal comprises tungsten, titanium, or tantalum, and the refractory metal silicide comprises tungsten silicide, titanium silicide, tantalum silicide, or cobalt silicide.

9. A method as claimed in claim 1, wherein the plugs and the wordlines are formed concurrently of an identical material.

10. A method for fabricating a mask ROM, comprising:
providing a semiconductor substrate;
defining the semiconductor substrate into a memory cell region and a peripheral circuit region;
forming isolating insulating films to define active regions at fixed intervals extending in one direction in the memory cell region of the semiconductor substrate;
forming conductive layer patterns on the active regions at fixed intervals in vertical and horizontal directions in the memory cell region, and forming a gate electrode in the peripheral circuit region of the semiconductor substrate;
removing the isolating insulating films from portions between the conductive layer patterns in a direction perpendicular to the active regions;
forming a first of two first and second impurity regions in the memory cell region of the semiconductor substrate where the isolating insulating films are removed therefrom, and concurrently forming a second of the two first and second impurity regions in the semiconductor substrate on both sides of the gate electrode;
forming an insulating film on an entire surface of the substrate inclusive of the conductive layer patterns;
selectively removing the insulating film on the conductive layer patterns to form contact holes;
forming a plug formed in each of the contact holes; and,
forming wordlines on the insulating film on the active regions.

11. A method as claimed in claim 10, further comprising forming the first and second impurity regions in a direction perpendicular to the active regions.

12. A method as claimed in claim 10, wherein the forming of the first of the two first and second impurity regions and the forming a second of the two first and second impurity regions are done simultaneously.

13. A method as claimed in claim 10, wherein the conductive layer patterns comprise one or more materials selected from polysilicon, refractory metals, and refractory metal silicides, and the wordlines comprise refractory metals or refractory metal silicides.

14. A method as claimed in claim 10, wherein the conductive layer patterns comprise polysilicon, and the wordlines comprise tungsten, titanium, tantalum, tungsten silicide, titanium silicide, tantalum silicide, or cobalt silicide.

15. A method as claimed in claim 13, wherein the refractory metal comprises tungsten, titanium, or tantalum, and the refractory metal silicide comprises tungsten silicide, titanium silicide, tantalum silicide, and cobalt silicide.

16. The method of claim 3, wherein the semiconductor substrate is defined as a memory cell region and a peripheral circuit region and wherein the first and second impurity regions are formed on active regions in the memory cell region and a second set of first and second impurity regions are formed on the sides of a gate electrode in the peripheral cell region, wherein the second set of first and second impurity regions are formed concurrently with the other first and second impurity regions.

17. The method of claim 1, wherein the semiconductor substrate is defined as a memory cell region and a peripheral circuit region and wherein the first and second impurity regions are formed on active regions in the memory cell region and a second set of first and second impurity regions are formed on the sides of a gate electrode in the peripheral cell region, wherein the second set of first and second impurity regions are formed concurrently with the first and second impurity regions.

18. The method of claim 17, wherein the second set of first and second impurity regions and the first and second impurity regions are formed by concurrent impurity ion injection.

19. The method of claim 1, wherein the wordline has a constant width.

20. The method of claim 10, wherein the conductive layer patterns are formed on the first insulating film at fixed intervals in vertical and horizontal directions on the semiconductor substrate, and wherein vertical and horizontal edges of the conductive layer patterns overlap the first and second impurity regions.

21. The method of claim 20, wherein the wordlines extend in the one direction and have the same width as the conductive layer pattern in a direction perpendicular to the active regions.

22. A method for fabricating a mask ROM, comprising:
providing a semiconductor substrate;
forming first and second impurity regions alternatively in the semiconductor substrate;
forming a first insulating film on an entire surface of the semiconductor substrate;
forming a plurality of conductive layer patterns on the first insulating film between the first and second impurity regions, wherein the conductive layer patterns are formed on the first insulating film at fixed intervals in vertical and horizontal directions on the semiconductor substrate, with both edges thereof overlapped with the first and second impurity regions;
forming a second insulating film on an entire surface of the first insulating film inclusive of the conductive layer patterns;
forming contact holes in the second insulating film on the conductive layer patterns;
forming plugs in the contact holes; and
forming wordlines.

23. The method of claim 22, wherein each wordline has a width which is the same width as the conductive layer pattern in a direction crossing the first and second impurity regions.

* * * * *